US007429855B2

(12) United States Patent
Rozman (10) Patent No.: US 7,429,855 B2
(45) Date of Patent: Sep. 30, 2008

(54) REGENERATIVE LOAD BANK WITH A MOTOR DRIVE

(75) Inventor: Gregory I. Rozman, Rockford, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 554 days.

(21) Appl. No.: 11/186,653

(22) Filed: Jul. 21, 2005

(65) Prior Publication Data

US 2006/0060396 A1 Mar. 23, 2006

Related U.S. Application Data

(60) Provisional application No. 60/611,380, filed on Sep. 20, 2004.

(51) Int. Cl.
*G01R 19/00* (2006.01)
(52) U.S. Cl. ....................................................... 324/107

(58) Field of Classification Search .................. 363/34, 363/35, 37; 324/107
See application file for complete search history.

(56) References Cited

U.S. PATENT DOCUMENTS

| 5,650,713 | A  | * | 7/1997  | Takeuchi et al. ............. 322/16 |
|-----------|----|---|---------|-------------------------------------|
| 6,538,412 | B1 | * | 3/2003  | Klose et al. ................. 318/801 |
| 6,611,438 | B2 | * | 8/2003  | Kawazoe et al. ............. 363/37 |
| 6,654,260 | B2 | * | 11/2003 | Okayama et al. ............. 363/37 |
| 6,697,268 | B2 | * | 2/2004  | Tomonaga ................... 363/37 |
| 6,774,608 | B2 | * | 8/2004  | Hofstetter et al. ............ 322/24 |
| 2002/0163819 | A1 | * | 11/2002 | Treece ....................... 363/34 |
| 2003/0007368 | A1 | * | 1/2003  | Kawazoe et al. ............. 363/34 |
| 2003/0155893 | A1 | * | 8/2003  | Schreiber .................... 322/12 |
| 2003/0214823 | A1 | * | 11/2003 | Kawazoe et al. ............. 363/37 |

\* cited by examiner

*Primary Examiner*—Shawn Riley
(74) *Attorney, Agent, or Firm*—Stephen G. Mican (57) ABSTRACT

An electronic power converter for a generator under test that emulates resistive and inductive-capacitive (LC) loads and regenerates energy from the generator back to a utility grid.

21 Claims, 7 Drawing Sheets

REGENERATIVE LOAD BANK WITH A MOTOR DRIVE

CROSS REFERENCE TO RELATED APPLICATIONS

This Application claims the benefit of the filing date for prior filed co-pending Provisional Application Ser. No. 60/611,380, filed 20 Sep. 2004.

FIELD OF THE INVENTION

The invention relates to test equipment for high power alternating current power generation equipment, and more particularly to an improved load bank system for testing high power alternating current generators.

BACKGROUND OF THE INVENTION

Currently, test stands are used to perform endurance tests on high power alternating current (AC) generators, such as aircraft generators. A typical test stand comprises a prime mover, a gearbox installed between the prime mover and a generator under test, a resistive load bank, a generator control unit (GCU) with associated potential and current sensors at the point-of-regulation (POR), generator cooling accessories and support instrumentation. The prime mover is commonly a direct current (DC) motor, although an AC motor with a suitable motor controller is also satisfactory.

A resistive load bank typically comprises a set of water-cooled resistive elements that are switched by a corresponding set of mechanical relays. The resistive load bank operates inherently at the unity power factor (PF) and has a very fast loading response due to characteristics of mechanical contactors of the relays. When variable leading (capacitive) or lagging (inductive) load is required, an additional resistive-inductive-capacitive (RLC) load bank is connected to the POR. Loading the generator with a resistive load bank is required to characterize generator electrical performance, such as load-on and load-off transient responses. However, for generator endurance testing at rated power, the resistive load bank is very inefficient since electrical energy is wasted in the resistive elements.

SUMMARY OF THE INVENTION

The invention comprises an electronic power converter that emulates resistive and inductive-capacitive (LC) loads for a generator under test and regenerates energy from the generator back to a utility grid. The invention also comprises an electronic power converter that in addition of emulating resistive and LC loads has an integrated motor drive that controls the speed of the prime mover. In this case, the utility grid provides only a small amount of power to compensate losses in the closed loop system that comprises the prime mover and generator under test.

The invention operates as a regenerative load bank (RLB) that is a viable alternative to the resistive load bank. Rather than dissipating generated power in the resistive elements of the resistive load bank, the RLB feeds power generated by the unit under test back into the utility grid. The RLB dramatically reduces power demand from the grid during generator testing, reduces water demand otherwise required for cooling waste heat of resistive elements in the resistive load bank and reduces floor "footprint" in comparison with the resistive load bank. In addition, the RLB allows loading generator with unity, leading, or lagging PF programmable by operator and enables high fidelity emulation of various high-power electrical loads, such as typical electrical loads aboard aircraft, by modulating loading characteristics.

In a preferred embodiment, the invention comprises a regenerative load bank (RLB) for a generator under test that produces a polyphase alternating current (AC) power output that is driven by a prime mover powered by a polyphase (AC) utility grid, comprising: a first power converter for converting the AC power output of the generator to direct current (DC) power; a second power converter for converting DC power to AC power for coupling to the utility grid; and a DC link for coupling the DC power output of the first power converter to the second power converter so that power generated by the generator is transferred to the utility grid.

DETAILED DESCRIPTION OF THE INVENTION

Figure 1:
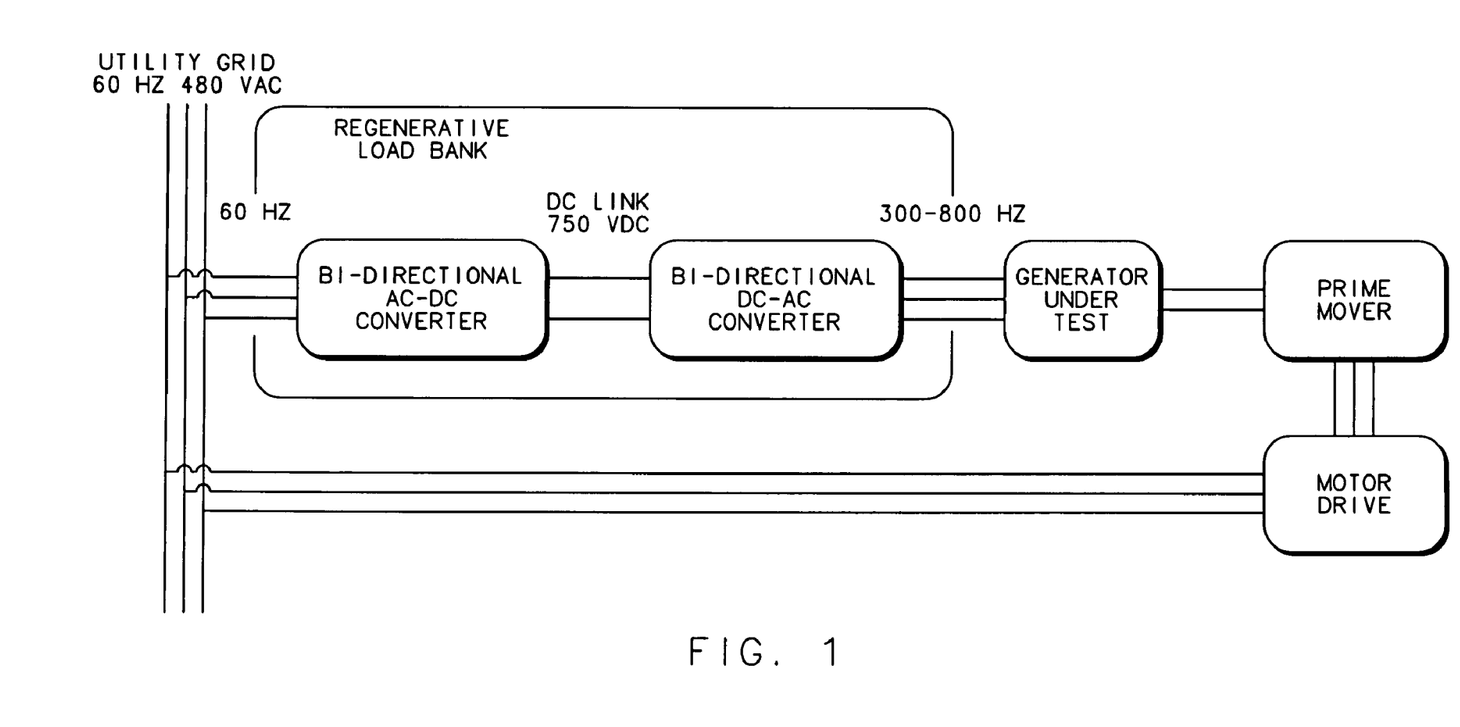
FIG. 1 shows a regenerative test stand system with a regenerative load bank according to a preferred embodiment of the invention.

FIG. 1 shows a regenerative test stand configuration 2 with a regenerative load bank according to a preferred embodiment of the invention. A utility grid 4 supplies power, typically polyphase alternating current (AC) power of the three-phase type, as shown, to an electronic motor drive 6 by way of motor drive supply lines 8. The motor drive 6 provides suitable power to drive a prime mover 10 by way of prime mover supply lines 11.

The prime mover 10 may comprise a DC or AC motor. If the prime mover 10 comprises a DC motor, the motor drive 6 comprises a variable potential DC source. If the prime mover 10 comprises an AC motor, the motor drive 6 comprises a source of selectable variable frequency polyphase AC power, typically three-phase. If the prime mover 10 is a motor of the induction or synchronous type, the AC current supplied by the motor drive 6 is sinusoidal. If the prime mover 10 is a motor of the "brushless DC" type, the AC current supplied by the motor drive 6 is rectangular.

The prime mover 10 couples to a generator 12 under test by way of a mechanical coupling 14, typically a driveshaft or gearbox, to drive the generator 12. The generator 12 in turn develops power, typically polyphase AC power of the three-phase type, and distributes it to a regenerative load bank (RLB) 16 according to the invention by way of RLB supply lines 18.

The RLB 16 comprises a generator side power converter 20 that serves as an active rectifier system. The generator side power converter 20 couples to a grid side power converter 22 that serves as an inverter system by way of a DC link 24. The power converters 20, 22 are conveniently two four-quadrant switch-mode inverters linked together by the DC link 24. The grid side power converter 22 converts the DC link power back to polyphase AC power and distributes it back to the utility grid 4 by way of grid supply lines 26. In the most basic sense, the power converter 20 provides a load for endurance testing the generator 12, and the power rectified by the power converter 20 is then returned to the utility grid 4 by the power converter 22 rather than simply dissipated as heat, as it is in the case of a resistive load bank. Furthermore, as explained below, the power converter 20 may be controlled to provide an adjustable power factor that allows the simulation loads with any degree of leading or lagging power factor.

Figure 2:
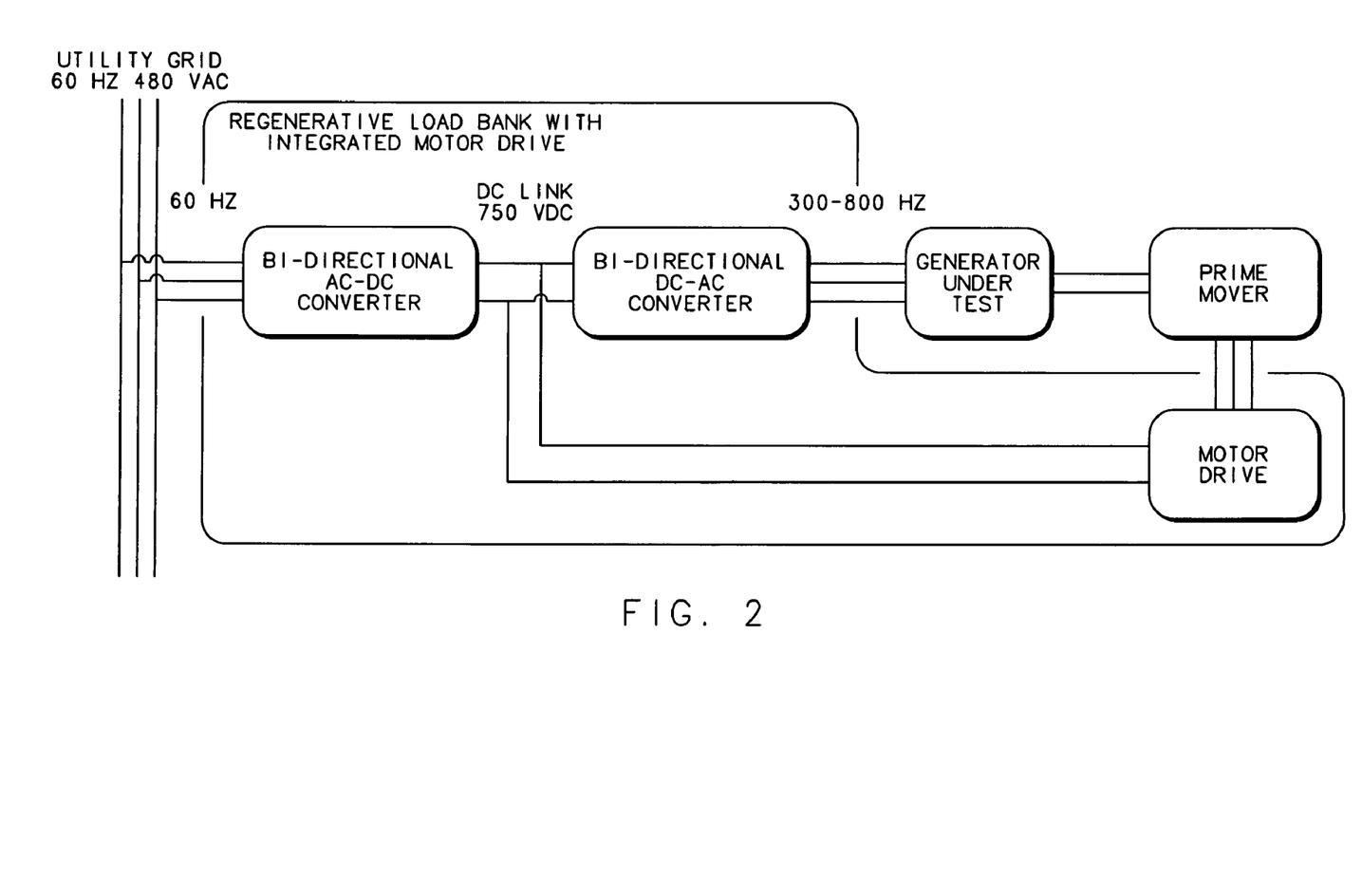
FIG. 2 shows a regenerative test stand system with a regenerative load bank with an integrated motor drive according to a preferred embodiment of the invention.

FIG. 2 shows a regenerative test stand system 28 with a regenerative load bank with an integrated motor drive according to a preferred embodiment of the invention. It is very similar in operation to the regenerative test stand system 2 described above in connection with FIG. 1. The difference is that it has a RLB 30 with an integral motor drive 32. The RLB 30 converts power supplied by the power converter 20 on the DC link 24 through motor drive supply lines 34. Thus, the motor drive 32 converts DC power on the DC link 24 to selectable power suitable to drive the prime mover 10 by way of prime mover supply lines 12. In this way, the power converter 22 only has to convert the portion of the power delivered to motor drive 30, thus increasing efficiency and decreasing heat, weight and volume of the regenerative test stand 28.

Figure 3:
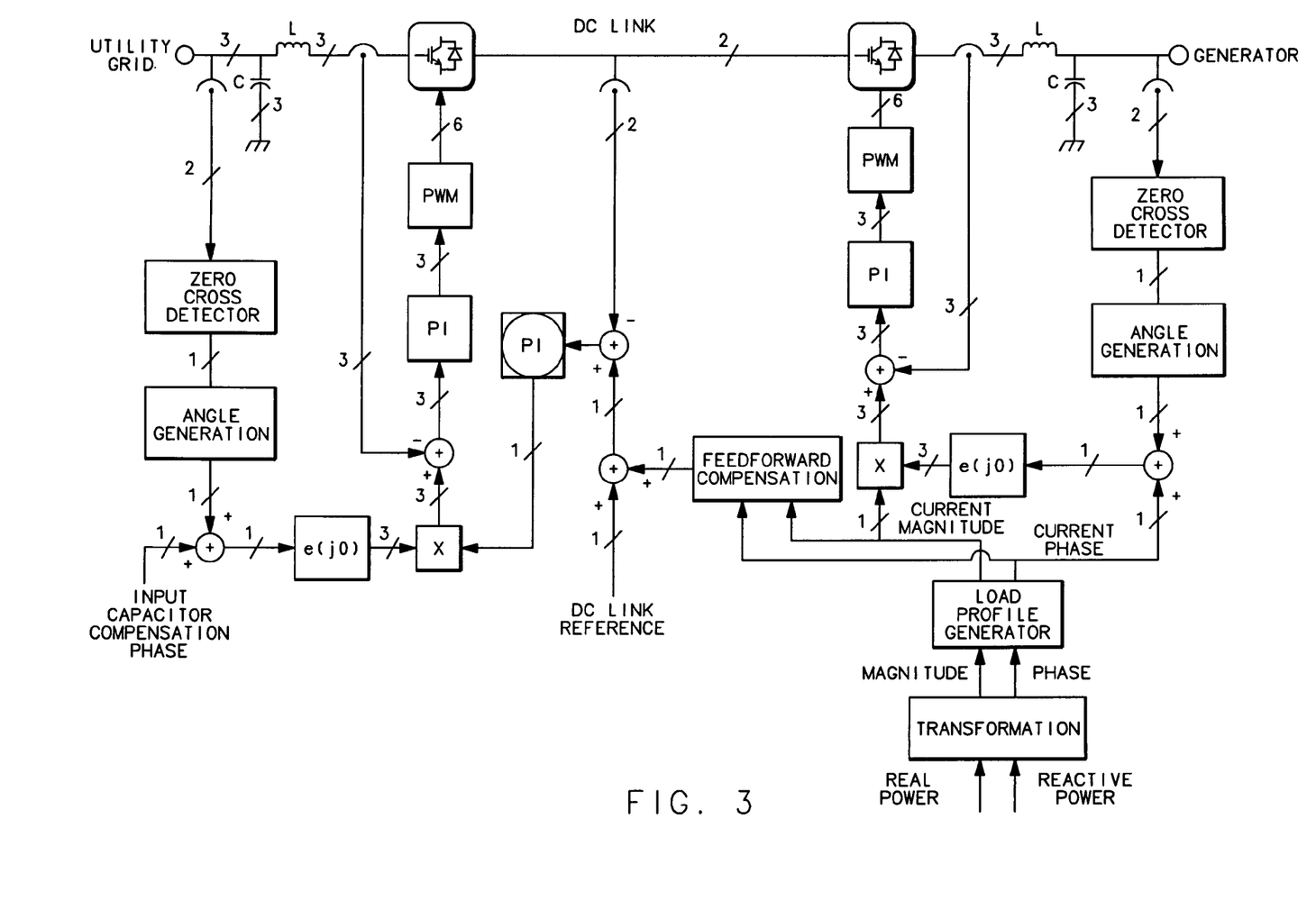
FIG. 3 shows a single line control diagram for a regenerative test stand system with a regenerative load bank according to a preferred embodiment of the invention.
Figure 4A:
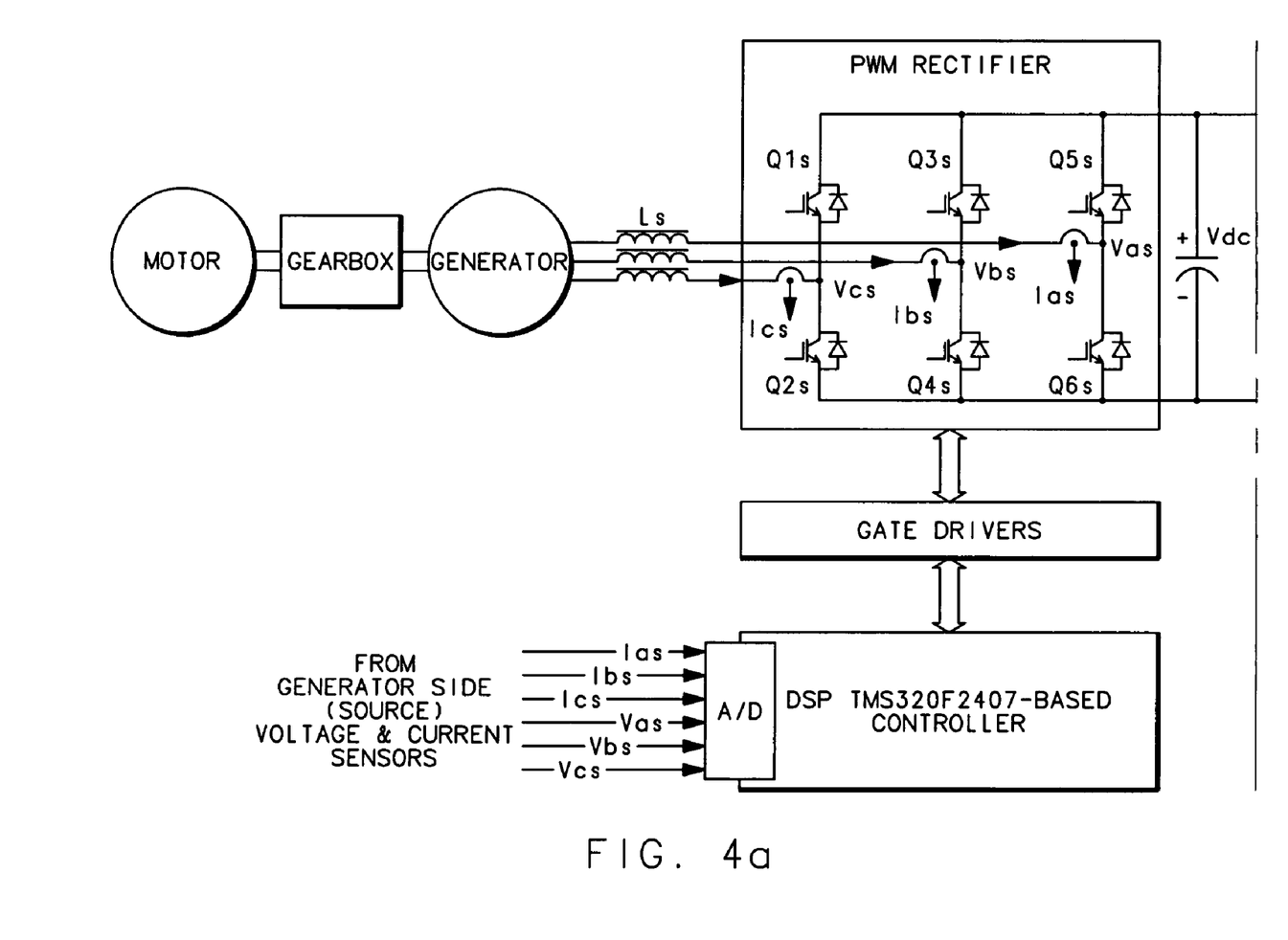
FIG. 4 shows a functional block diagram of a regenerative load bank according to a preferred embodiment of the invention.
Figure 4B:
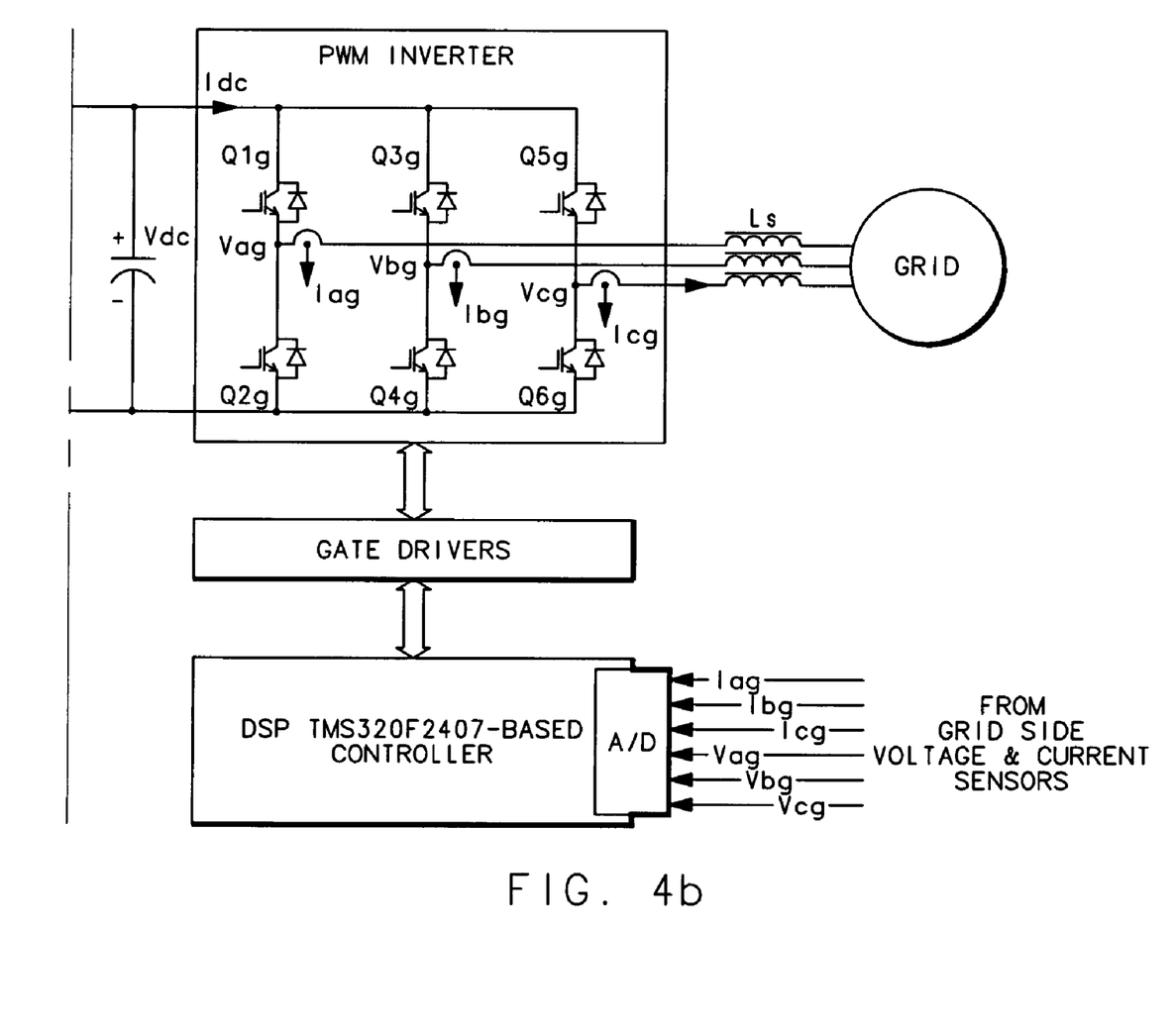

FIG. 3 shows a single line control diagram of the regenerative test stand system 2 with the regenerative load bank 16 according to a preferred embodiment of the invention. FIG. 4 shows a functional block diagram of the regenerative load bank 16 according to a preferred embodiment of the invention. The generator 12 connects to the generator side power converter 20, shown as an RLB pulse width modulated (PWM) converter, through an inductor 36 ($L_s$). The input signals for the generator side power converter 20 are POR potentials and currents. A generator side digital signal processor (DSP) 38, such as a TMS320LF2407 16-bit fixed-point DSP from Texas Instruments, controls computation. The generator side DSP 38 controls generator loading characteristics, such as load current and PF, in response to the input commands from the operator, such as by Ethernet. The DSP 38 controls the power converter 20 through gate drivers 40.

The grid side power converter 22 connects to the grid 4 through an inductor 42 ($L_g$). A grid side DSP 44, such as a TMS320LF2407 DSP, implements control algorithms and generates PWM signals to the grid side power converter 22 through gate drivers 46. The grid side DSP 44 is responsible for DC link potential control and unity PF at the grid.

Figure 5A:
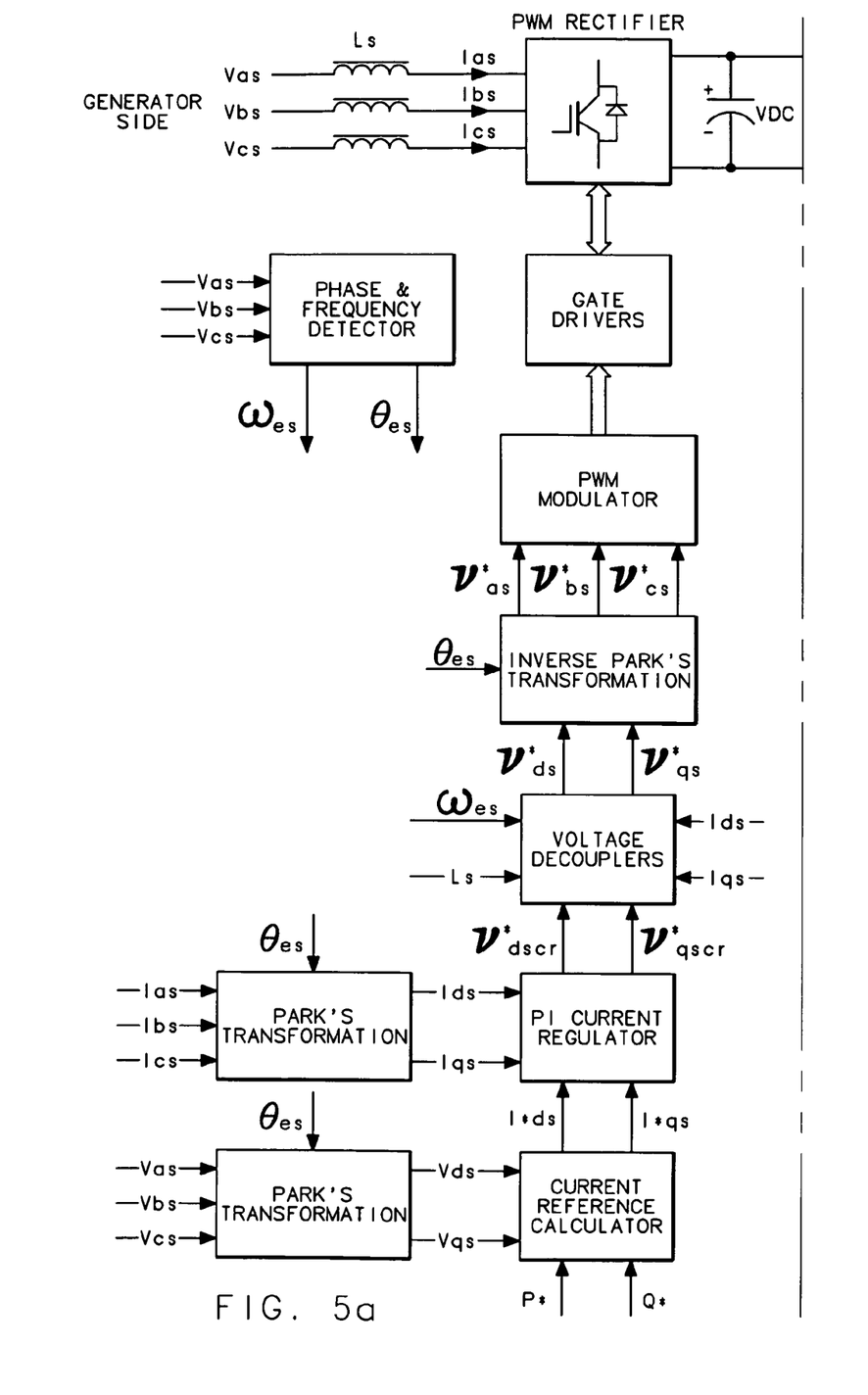
FIG. 5 shows a control block diagram for implementation of a regenerative load bank in the synchronous (rotating) reference frame according to a preferred embodiment of the invention.
Figure 5B:
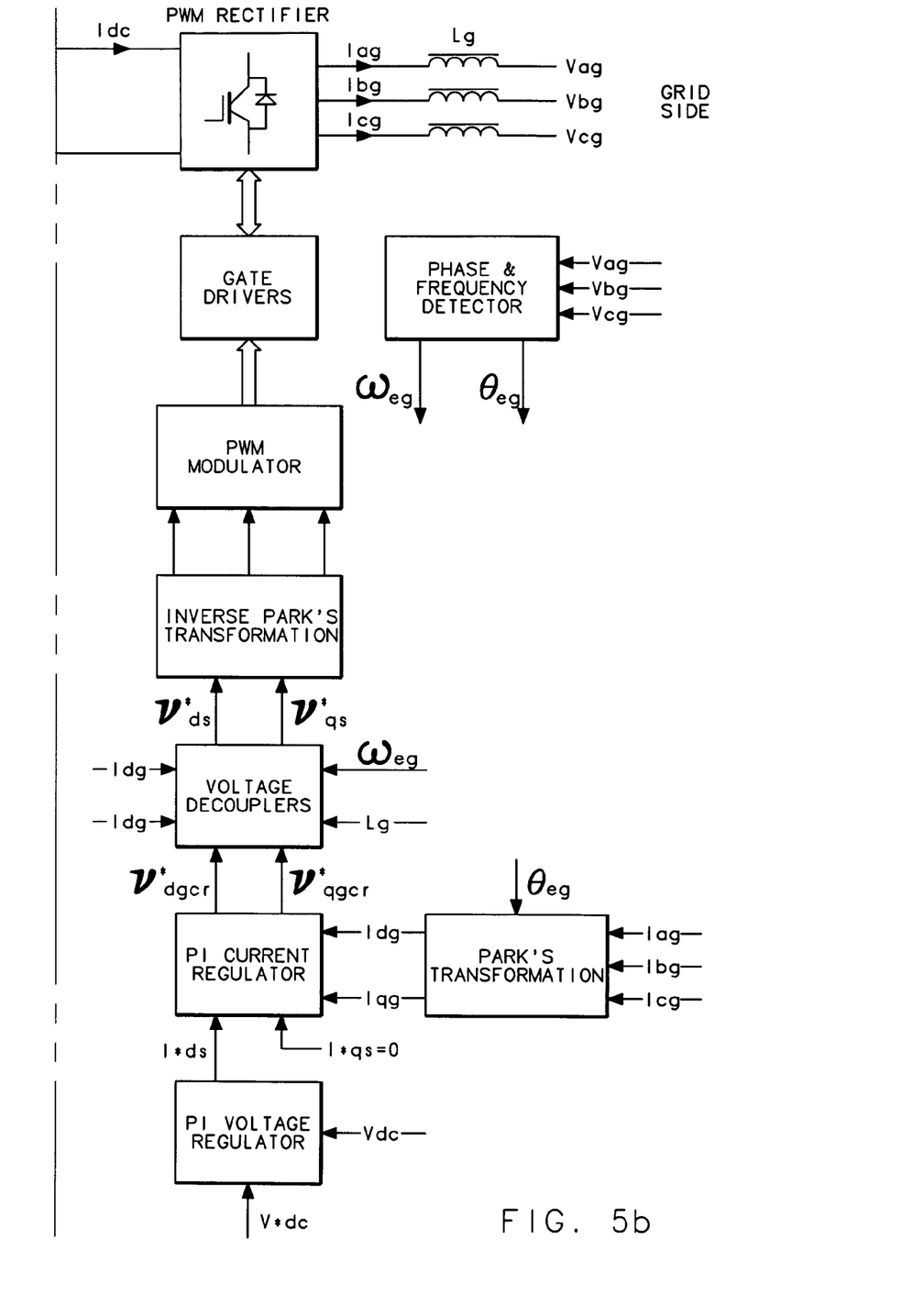

FIG. 5 shows a control block diagram for implementation of the RLB 16 in the synchronous (rotating) reference frame according to a preferred embodiment of the invention. The RLB 16 contains the power converters 20, 22 as two four-quadrant switch-mode inverters linked together by the common DC bus 24. The power converter 20 connected to the generator operates as an active rectifier by converting AC power from the generator to DC power. The power converters 20, 22 are capable of controlling generator and grid current waveforms to be sinusoidal at a unity power factor. In addition, the generator side power converter 20 provides operation at leading and lagging power factors. The controller hardware implementation includes phase and frequency detectors 48, 50 to synchronize generator variable frequency and the grid constant frequency into mod 2pi angle generation to be used in Park's transformations 52, 54, 56 and inverse Park's transformations 58, 60.

Proportional-integral (PI) current regulators 62, 64 are implemented in the synchronous DQ-reference frame, where the current components are regulated as DC quantities. Alternatives to this approach are stationary PI regulators or hysteresis regulators as shown in FIG. 3.

Generator d-axis and q-axis stator current references $I_{ds}*$ and $I_{qs}*$ for generator side current regulator 62 are set by the generator load and PF requirements or by real P* and reactive Q* power requirements as determined by power controller 66. To achieve unity PF at the grid current reference of q-axis $I_{qg}*$ should be set to 0. The current reference of d-axis $I_{dg}*$ is defined by potential regulator 68.

Mutual potential coupling exists in the synchronous DQ current regulators 62, 64. Potential decoupling is therefore recommended with potential decouplers 70, 72 to improve current responses and is shown below for the generator side potential decoupler 70:

$$V_{ds}* = -V_{dscr}* + \omega_{es} L_s I_{qs}$$

$$V_{qs}* = -V_{qscr}* - \omega_{es} L_s I_{ds}$$

Similarly, the grid side potential decoupler 72 outputs are computed by:

$$V_{dg}* = V_{dgcr}* - \omega_{eg} L_g I_{qg}$$

$$V_{qg}* = V_{qgcr}* + \omega_{eg} L_g I_{dg}$$

The PI potential regulator 68 is responsible for maintaining DC link potential at predetermined level. During generator load-on condition, a DC link capacitor 74 in the DC link 24 is charged by the generator current loop. The grid side power converter 22 is supplying DC link current out of the DC link capacitor 74 to the grid by controlling DC link potential. Output of the potential regulator 68 is current reference $I_{dg}*$ to the grid side current regulator 64.

The power controller 66 governs the quadrature and direct components of the current references $I_{ds}*$ and $I_{qs}*$. The generator side current regulator 60 has to maintain a power factor, programmable by the operator, and needs to be kept constant within generator operating frequency and load.

To achieve power control the DQ components of the generator potentials are used.

$$I_{ds}^* = \frac{P^* V_{ds} + Q^* V_{qs}}{V_{ds}^2 + V_{qs}^2}$$

$$I_{qs}^* = \frac{P^* V_{qs} - Q^* V_{ds}}{V_{ds}^2 + V_{qs}^2}$$

These current references are derived from input power references and DQ components of the generator potentials.

Described above is an electronic power converter that emulates resistive and inductive-capacitive (LC) loads for a generator under test and regenerates energy from the generator back to a utility grid. It should be understood that the described embodiments are only illustrative implementations of the invention, that the various parts and arrangement thereof may be changed or substituted, and that the invention is only limited by the scope of the attached claims.

NOMENCLATURE $I_{ds}$ Generator d-axis stator current
$I_{qs}$ Generator q-axis stator current
$V_{qs}$ Generator d-axis stator terminal potential
$V_{ds}$ Generator q-axis stator terminal potential
$\omega_{eg}$ Grid electrical frequency $\omega_{es}$ Generator electrical frequency
$I_{dg}$ Grid d-axis current
$I_{qg}$ Grid q-axis current
$V_{dg}$ Grid d-axis potential
$V_{qg}$ Grid q-axis potential
$L_s$ Active rectifier inductor
$L_g$ Grid inverter inductor
P Real power
Q Reactive power
\* Notation for command or reference variables (power, current, potential)

What is claimed is:

1. A regenerative load bank (RLB) for a generator under test that produces a polyphase alternating current (AC) power output that is driven by a prime mover powered by a polyphase (AC) utility grid, comprising:
a first power converter for converting the AC power output of the generator to direct current (DC) power that loads the generator with a current and a power factor that simulates an electrical load corresponding to real power and reactive power control signals that represent the characteristics of the simulated electrical load;
a second power converter for converting DC power to AC power for coupling to the utility grid; and
a DC link for coupling the DC power output of the first power converter to the second power converter so that power generated by the generator is transferred to the utility grid.

2. The RLB of claim 1, wherein the first and second power converters comprise four-quadrant switch-mode inverters linked together by the DC link.

3. The RLB of claim 1, wherein the first power converter is an active rectifier.

4. The RLB of claim 1, wherein the second power converter is an inverter.

5. The RLB of claim 1, wherein the prime mover is controlled by a motor drive that is coupled to the utility grid.

6. The RLB of claim 1, further comprising an integral motor drive for controlling the prime mover that is coupled to the DC link.

7. The RLB of claim 1, wherein the loading characteristics of the first power converter on the generator, such as load current and power factor, are controlled to emulate desired resistive and inductive-capacitive (LC) loads.

8. The RLB of claim 1, wherein the polyphase AC is three-phase.

9. A regenerative load bank (RLB) for a generator under test that produces a polyphase alternating current (AC) power output that is driven by a prime mover powered by a polyphase (AC) utility grid, comprising:
an active rectifier comprising a four-quadrant switch-mode inverter for converting the AC power output of the generator to direct current (DC) power that loads the generator with a current and a power factor that simulates an electrical load corresponding to real power and reactive power control signals that represent the characteristics of the simulated electrical load;
an inverter comprising a four-quadrant switch-mode inverter for converting DC power to AC power for coupling to the utility grid; and
a DC link for coupling the DC power output of the first power converter to the second power converter so that power generated by the generator is transferred to the utility grid.

10. The RLB of claim 9, wherein the prime mover is controlled by a motor drive that is coupled to the utility grid.

11. The RLB of claim 9, further comprising an integral motor drive for controlling the prime mover that is coupled to the DC link.

12. The RLB of claim 9, wherein the loading characteristics of the active rectifier on the generator, such as load current and power factor, are controlled to emulate desired resistive and inductive-capacitive (LC) loads.

13. The RLB of claim 9, wherein the polyphase AC is three-phase.

14. A regenerative test stand system powered by a utility grid for testing a polyphase alternating current (AC) generator, comprising:
a motor drive for selectively powering a prime mover;
a prime mover powered by the motor drive and coupled to the generator under test for driving the generator;
a first power converter for converting the AC power output of the generator to direct current (DC) power that loads the generator with a current and a power factor that simulates an electrical load corresponding to real power and reactive power control signals that represent the characteristics of the simulated electrical load;
a second power converter for converting DC power to AC power for coupling to the utility grid; and
a DC link for coupling the DC power output of the first power converter to the second power converter so that power generated by the generator is transferred to the utility grid.

15. The RLB of claim 14, wherein the first and second power converters comprise four-quadrant switch-mode inverters linked together by the DC link.

16. The RLB of claim 14, wherein the first power converter is an active rectifier.

17. The RLB of claim 14, wherein the second power converter is an inverter.

18. The RLB of claim 14, wherein the prime mover is controlled by a motor drive that is coupled to the utility grid.

19. The RLB of claim 14, further comprising an integral motor drive for controlling the prime mover that is coupled to the DC link.

20. The RLB of claim 14, wherein the loading characteristics of the first power converter on the generator, such as load current and power factor, are controlled to emulate desired resistive and inductive-capacitive (LC) loads.

21. The RLB of claim 14, wherein the polyphase AC is three-phase.

\* \* \* \* \*